(12) United States Patent
Nobori et al.

(10) Patent No.: US 9,533,920 B2
(45) Date of Patent: Jan. 3, 2017

(54) CERAMIC HEATER AND METHOD FOR PRODUCING THE SAME

(71) Applicant: NGK Insulators, Ltd., Nagoya (JP)

(72) Inventors: Kazuhiro Nobori, Handa (JP); Takuji Kimura, Kariya (JP); Hidemi Nakagawa, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 258 days.

(21) Appl. No.: 14/208,605

(22) Filed: Mar. 13, 2014

(65) Prior Publication Data

US 2014/0284320 A1 Sep. 25, 2014

(30) Foreign Application Priority Data

Mar. 21, 2013 (JP) ................................. 2013-058388

(51) Int. Cl.
*H05B 3/10* (2006.01)
*C04B 35/645* (2006.01)
(Continued)

(52) U.S. Cl.
CPC .............. *C04B 35/645* (2013.01); *B32B 18/00* (2013.01); *C04B 35/111* (2013.01); *H01L 21/67103* (2013.01); *H01L 21/6831* (2013.01); *H05B 3/143* (2013.01); *C04B 2235/3206* (2013.01); *C04B 2235/3217* (2013.01);
(Continued)

(58) Field of Classification Search
CPC . H02N 13/00; H01L 21/6833; H01L 21/6831; H01L 21/67103; Y10T 29/23; B32B 18/00; C04B 35/645; C04B 35/111; C04B 2237/343; C04B 2237/36; C04B 2237/595; C04B 2237/08; C04B 2237/68; C04B 2235/3206; C04B 2235/3208; C04B 2235/3217; C04B 2235/3222; C04B 2235/445; C04B 2235/545; C04B 2235/656; C04B 2235/6567; C04B 2235/658; C04B 2235/6581; C04B 2235/77; C04B 2235/786; C04B 2235/80; C04B 2235/96; C04B 2235/963; C04B 2235/606; C04B 2235/6023; C04B 2235/72

See application file for complete search history.

(56) References Cited

U.S. PATENT DOCUMENTS 6,215,643 B1 * 4/2001 Nagasaki ............... H02N 13/00
279/128
8,178,455 B2 * 5/2012 Teratani .................. B32B 18/00
501/118
2010/0248935 A1 9/2010 Teratani et al.

FOREIGN PATENT DOCUMENTS

JP 53-040898 A 4/1978
JP 2011-168472 A1 9/2011

OTHER PUBLICATIONS

Japanese Office Action, Japanese Application No. 2013-058388, dated Sep. 6, 2016 (3 pages).

* cited by examiner

*Primary Examiner* — Shawntina Fuqua
(74) *Attorney, Agent, or Firm* — Burr & Brown, PLLC

(57) ABSTRACT

An electrostatic chuck 10 includes a disc-shaped alumina ceramic base 12, and a heater electrode 14 and an electrostatic electrode 16 that are embedded in the alumina ceramic base 12. An upper surface of the alumina ceramic base 12 functions as a wafer-receiving surface 12a. The heater electrode 14 is formed in a pattern shape, for example, in the manner of a single brush stroke so as to be arranged over the entire surface of the alumina ceramic base 12. When a voltage is applied to the heater electrode 14, the heater (Continued)

electrode 14 generates heat, and heats a wafer W. This heater electrode 14 contains $TiSi_2$ as a main component.

6 Claims, 6 Drawing Sheets

(51) Int. Cl.
*H01L 21/67* (2006.01)
*H01L 21/683* (2006.01)
*H05B 3/14* (2006.01)
*B32B 18/00* (2006.01)
*C04B 35/111* (2006.01)

(52) U.S. Cl.
CPC  *C04B 2235/445* (2013.01); *C04B 2235/5445* (2013.01); *C04B 2235/606* (2013.01); *C04B 2235/6023* (2013.01); *C04B 2235/6567* (2013.01); *C04B 2235/6581* (2013.01); *C04B 2235/72* (2013.01); *C04B 2237/08* (2013.01); *C04B 2237/343* (2013.01); *C04B 2237/36* (2013.01); *C04B 2237/595* (2013.01); *C04B 2237/68* (2013.01)

(a)

(b)

(c)

(d)

CERAMIC HEATER AND METHOD FOR PRODUCING THE SAME

BACKGROUND OF THE INVENTION

1. Field of the Invention

The present invention relates to a ceramic heater and a method for producing the same.

2. Description of the Related Art

A known ceramic heater used for heating a semiconductor wafer is a disc-shaped alumina sintered body in which a heater electrode is embedded. For example, PTL 1 discloses a method for obtaining a ceramic heater, the method including preparing two molded bodies obtained by molding a mixed powder of alumina and magnesium fluoride so as to have a predetermined shape, arranging, on one of the molded bodies, a paste which is to become a heater electrode, then stacking the other molded body, and conducting firing at a low firing temperature of 1,120° C. to 1,300° C. In the production process of a ceramic heater, in the case where high-temperature firing at 1,700° C. is conducted, when tungsten carbide (WC) is used as a paste, WC is sufficiently sintered and appropriate electrical properties of a heater electrode are obtained. In contrast, in the case where low-temperature firing at 1,120° C. to 1,300° C. is conducted, the following problems occur. When WC is used as a paste, detachment of particles significantly occurs and the electrical resistance cannot be measured. When a mixed powder of WC and alumina is used as a paste, densification of the resulting electrode does not sufficiently occur, and sufficient electrical properties are not obtained (Comparative Examples 21 and 22 of PTL 1). Under this circumstance, for example, a mixed powder of WC, Ni, and alumina is used as a paste in PTL 1.

CITATION LIST

Patent Literature

[PTL 1] Japanese Unexamined Patent Application Publication No. 2011-168472

SUMMARY OF THE INVENTION

As described above, in the case where a ceramic heater is produced by low-temperature firing, it may be possible to use a mixed powder of WC, Ni, and alumina as a paste which is to become a heater electrode, as described in PTL 1. However, the material is not particularly limited to WC, and the development of an alternative material to WC has also been desired. The inventors of the present invention searched, as an alternative material to WC, a material that does not adversely affect the controllability of plasma and that has substantially the same electrical resistivity as WC. Molybdenum was examined as one of the candidates of such a material. However, in the case where a molybdenum paste was used, an undesirable problem in terms of the relationship among a preset temperature, a distance from the center of a ceramic heater, and electrical resistivity occurred. Specifically, the following problem occurred: When the distances from the center to a measurement position of the electrical resistivity are arranged in ascending order of electrical resistivity, the arrangement order in the case of measurement at 20° C. and the arrangement order in the case of measurement at 60° C. are different. This problem is referred to as the "phenomenon of reversal of temperature-dependence of resistivity". The occurrence of this reversal phenomenon is not preferable because it becomes very complicated to control the temperature of the ceramic heater.

To solve this problem, various materials of a heater electrode were examined. As a result, it was found that, when molybdenum containing a titanium component was used, the phenomenon of reversal of temperature-dependence of resistivity was improved. The reason for this is not certain, but is believed to be as follows: In the case where a titanium component is not contained, molybdenum carbide is produced and unevenly distributed in a heater electrode, and consequently, the reversal phenomenon is caused by the effect of the molybdenum carbide. In contrast, in the case where a titanium component is contained, the production of molybdenum carbide is suppressed, and consequently, the reversal phenomenon is suppressed. It is believed that the carbon source is a die composed of a carbon material and used in the firing and an organic component (such as a binder) contained in the heater electrode.

In the case where molybdenum containing a titanium component is used as a material of a heater electrode, although the phenomenon of reversal of temperature-dependence of resistivity is improved, the in-plane variation of the electrical resistivity cannot be sufficiently suppressed, resulting in a problem of a decrease in thermal uniformity of a wafer surface during plasma etching.

The present invention has been made in order to solve the above problems. A main object of the present invention is to suppress the in-plane variation of the electrical resistivity in a ceramic heater that includes a ceramic base and a heater electrode embedded in the ceramic base, while improving the phenomenon of reversal of temperature-dependence of resistivity.

A ceramic heater according to the present invention is a ceramic heater including a ceramic base and a heater electrode embedded in the ceramic base, in which the heater electrode contains $TiSi_2$ as a main component.

Since a main component of the heater electrode of this ceramic heater is $TiSi_2$, the phenomenon of reversal of temperature-dependence of resistivity is improved. In the case where a heater electrode that contains Mo as a main component and that does not contain Ti is used, it is believed that molybdenum carbide is produced and unevenly distributed, and consequently, the reversal phenomenon is caused by the effect of the molybdenum carbide. In contrast, in the case where a heater electrode that contains $TiSi_2$ as a main component is used as in the present invention, it is believed that carbonization does not substantially occur, and as a result, the reversal phenomenon is suppressed. Furthermore, the in-plane variation of the electrical resistivity is sufficiently suppressed. In the case of a heater electrode that contains Mo as a main component and Ti, the reversal phenomenon is suppressed as in the present invention. However, molybdenum carbide is produced, though the amount thereof is small, and thus the in-plane variation of the electrical resistivity is generated to some extent. In contrast, in the case where a heater electrode that contains $TiSi_2$ as a main component is used as in the present invention, carbonization does not substantially occur, and thus the in-plane variation of the electrical resistivity is also sufficiently suppressed.

In the ceramic heater according to the present invention, the heater electrode preferably contains the same material as the ceramic base. With this structure, since the difference in a thermal expansion coefficient between the heater electrode and the ceramic base can be reduced, cracks and the like are not easily generated during production.

In the ceramic heater according to the present invention, the ceramic base is preferably composed of alumina. Since a sintering temperature of alumina is generally lower than that of aluminum nitride, the ceramic heater can be easily produced. The ceramic base is more preferably composed of alumina containing magnesium fluoride. In this case, since magnesium fluoride has been added to an alumina powder, the firing temperature may be determined to be low as compared with the case where magnesium fluoride is not added.

A method for producing a ceramic heater according to the present invention includes the steps of:

(a) preparing each of a first ceramic molded body and a second ceramic molded body by pouring, into a molding die, a slurry containing an alumina powder, magnesium fluoride serving as a sintering aid, a solvent, a dispersant, and a gelling agent, causing gelation of the slurry by chemically reacting the gelling agent in the molding die, and then removing the molding die;

(b) obtaining a first ceramic calcined body and a second ceramic calcined body by drying, then degreasing, and further calcining the first ceramic molded body and the second ceramic molded body;

(c) printing a paste prepared by adding an alumina powder to a $TiSi_2$ powder on a surface of one of the first ceramic calcined body and the second ceramic calcined body; and (d) conducting hot-press firing at 1,120° C. to 1,300° C. in a state where the first ceramic calcined body and the second ceramic calcined body are overlapped with each other so as to sandwich the printed paste therebetween.

Alternatively, another method for producing a ceramic heater according to the present invention includes the steps of:

(a) preparing each of a first ceramic molded body and a second ceramic molded body by pouring, into a molding die, a slurry containing an alumina powder, magnesium fluoride serving as a sintering aid, a solvent, a dispersant, and a gelling agent, causing gelation of the slurry by chemically reacting the gelling agent in the molding die, and then removing the molding die;

(b) printing a paste prepared by adding an alumina powder to a $TiSi_2$ powder on a surface of one of the first ceramic molded body and the second ceramic molded body;

(c) obtaining a first ceramic calcined body and a second ceramic calcined body by drying, then degreasing, and further calcining the first ceramic molded body and the second ceramic molded body; and (d) conducting hot-press firing at 1,120° C. to 1,300° C. in a state where the first ceramic calcined body and the second ceramic calcined body are overlapped with each other so as to sandwich a portion where the paste has been printed therebetween.

According to the methods for producing a ceramic heater, the above-described ceramic heater according to the present invention can be easily produced. In addition, since ceramic calcined bodies are stacked and then subjected to hot-press firing, the numbers of times of firing are same in these ceramic calcined bodies. Therefore, the density becomes easily uniform and warpage is not easily generated in the heater electrode. Furthermore, in step (a), ceramic molded bodies are prepared by using a so-called gel-casting method. Specifically, a slurry is prepared by dispersing and mixing an alumina powder having a smaller diameter than an alumina granulated powder, the slurry is then subjected to gelation to prepare ceramic molded bodies, and the ceramic molded bodies thus obtained are used. Therefore, the density becomes easily uniform and warpage is not easily generated in the heater electrode.

In the methods for producing a ceramic heater according to the present invention, the paste may contain an organic substance, and a die used in the hot-press firing may be composed of a carbon material. Organic substances (for example, a binder and a dispersant) contained in the paste and a carbon material contained in a die for hot-press firing may become a carbon source. However, in these production methods, the main component of the paste is $TiSi_2$. Accordingly, $TiSi_2$ is not substantially carbonized by such a carbon source during hot-press firing.

DESCRIPTION OF THE PREFERRED EMBODIMENTS

Figure 1:
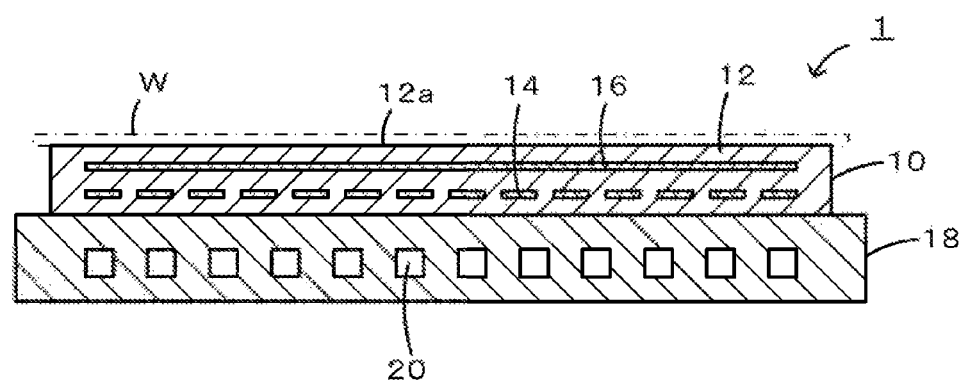
FIG. 1 is a cross-sectional view of a member 1 for a semiconductor production apparatus.

Preferred embodiments of the present invention will now be described with reference to the drawings. FIG. 1 is a cross-sectional view of a member 1 for a semiconductor production apparatus.

The member 1 for a semiconductor production apparatus includes an electrostatic chuck 10 that can attract a silicon wafer W to be subjected to a plasma treatment, and a cooling plate 18 serving as a support and disposed on a back surface of the electrostatic chuck 10.

The electrostatic chuck 10 includes a disc-shaped alumina ceramic base 12, and a heater electrode 14 and an electrostatic electrode 16 that are embedded in the alumina ceramic base 12. An upper surface of the alumina ceramic base 12 functions as a wafer-receiving surface 12a. The heater electrode 14 is formed in a pattern shape, for example, in the manner of a single brush stroke so as to be arranged over the entire surface of the alumina ceramic base 12. When a voltage is applied to the heater electrode 14, the heater electrode 14 generates heat, and heats the wafer W. This heater electrode 14 contains $TiSi_2$ as a main component. A voltage can be applied to the heater electrode 14 with rod-like terminals (not shown in the figure) respectively extending from a back surface of the cooling plate 18 to an end and another end of the heater electrode 14. The electrostatic electrode 16 is a planar electrode to which a DC voltage can be applied from an external power supply (not shown). When a DC voltage is applied to this electrostatic electrode 16, the wafer W is attracted and fixed to the wafer-receiving surface 12a by the Coulomb force or the Johnsen-Rahbek force. When the application of the DC voltage is released, the attraction and fixation of the wafer W to the wafer-receiving surface 12a are released.

The cooling plate 18 is a disc-shaped member composed of a metal (for example, composed of aluminum) and is bonded to a surface opposite to the wafer-receiving surface 12a of the electrostatic chuck 10 with a bonding layer (not shown) therebetween. The cooling plate 18 has a cooling medium passage 20 through which a cooling medium (for example, water) cooled by an external cooling device (not shown) circulates. The cooling medium passage 20 is formed, for example, in the manner of a single brush stroke so that the cooling medium passes over the entire surface of the cooling plate 18.

Next, an example of the use of the member 1 for a semiconductor production apparatus, the member 1 having the above-described structure, will be described. The member 1 for a semiconductor production apparatus is placed in a chamber (not shown) and is used for etching a surface of the wafer W by plasma generated in the chamber. In this case, the temperature of the wafer W is controlled to be constant by adjusting the amount of electric power supplied to the heater electrode 14 or by adjusting the flow rate of the cooling medium circulated through the cooling medium passage 20 of the cooling plate 18.

Figure 2:
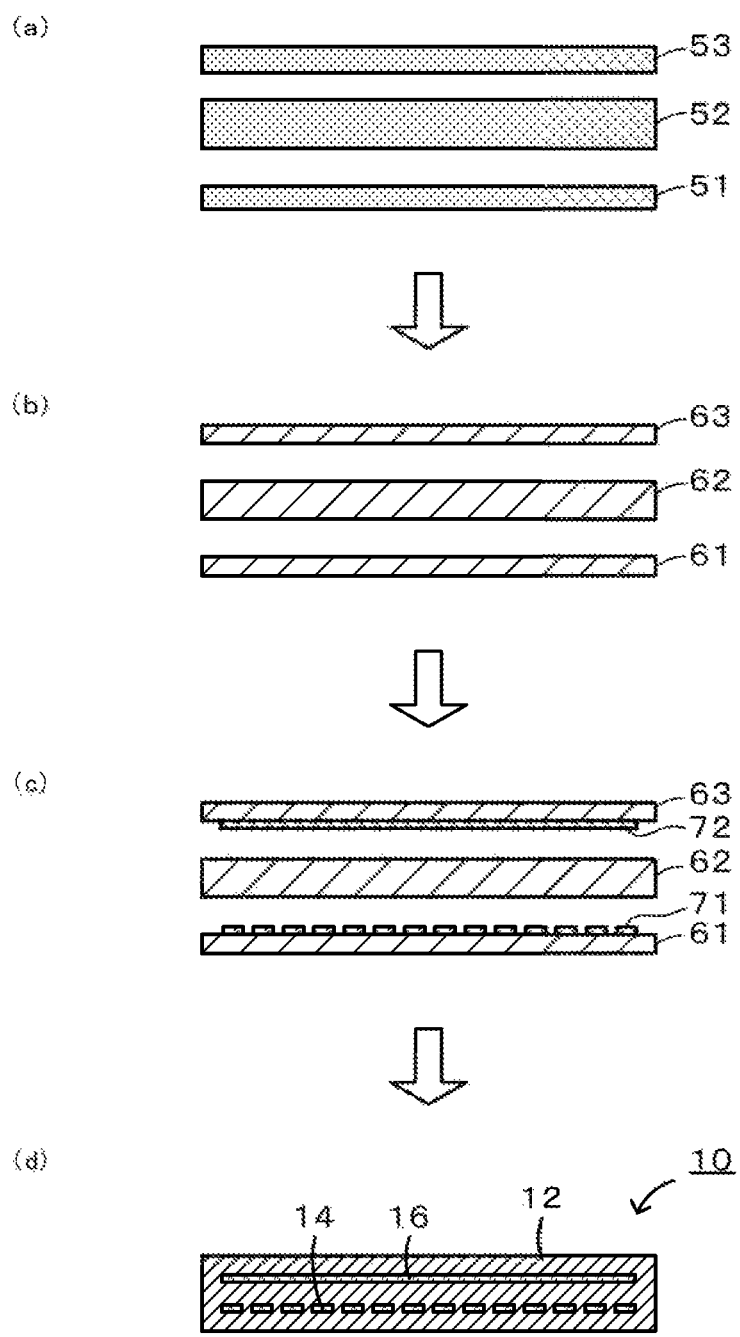
FIG. 2 includes process views showing a first production procedure of an electrostatic chuck 10.
Figure 3:
FIG. 3 includes process views showing a second production procedure of an electrostatic chuck 10.
Figure 3:
Figure 3:
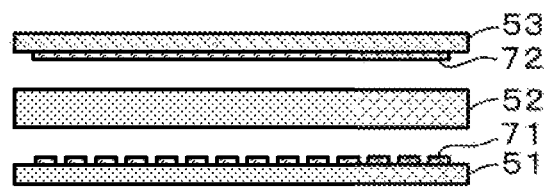
Figure 3:
Figure 3:
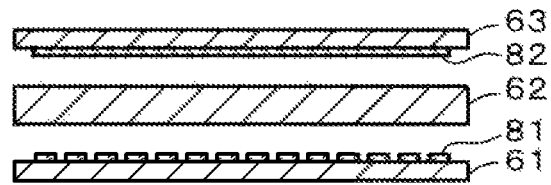
Figure 3:
Figure 3:
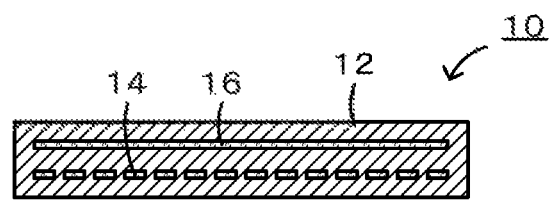

Next, production procedures of the electrostatic chuck 10 included in the member 1 for a semiconductor production apparatus will be described. Herein, two production procedures, namely, a first production procedure and a second production procedure will be described. FIG. 2 includes views illustrating the first production procedure, and FIG. 3 includes views illustrating the second production procedure.

1. First Production Procedure (Refer to FIG. 2)

(a) Preparation of Molded Bodies (Refer to FIG. 2(a))

First to third molded bodies 51 to 53 are prepared. The first to third molded bodies 51 to 53 are each prepared by, first, pouring, into a molding die, a slurry containing an alumina powder, magnesium fluoride serving as a sintering aid, a solvent, a dispersant, and a gelling agent, causing gelation of the slurry by chemically reacting the gelling agent in the molding die, and then removing the molding die.

The solvent is not particularly limited as long as the solvent dissolves the dispersant and the gelling agent. Examples thereof include hydrocarbon solvents (such as toluene, xylene, and solvent naphtha), ether solvents (such as ethylene glycol monoethyl ether, butyl carbitol, and butyl carbitol acetate), alcohol solvents (such as isopropanol, 1-butanol, ethanol, 2-ethyl hexanol, terpineol, ethylene glycol, and glycerin), ketone solvents (such as acetone and methyl ethyl ketone), ester solvents (such as butyl acetate, dimethyl glutarate, and triacetin), and polybasic acid solvents (such as glutaric acid). In particular, solvents having two or more ester bonds, such as polybasic acid esters (e.g., dimethyl glutarate) and acid esters of polyhydric alcohols (e.g., triacetin) are preferably used.

The dispersant is not particularly limited as long as the dispersant homogeneously disperses an alumina powder in a solvent. Examples thereof include polycarboxylic acid copolymers, polycarboxylic acid salts, sorbitan fatty acid esters, polyglycerol fatty acid esters, phosphate ester copolymers, sulfonate copolymers, and polyurethane-polyester copolymers having tertiary amines. In particular, polycarboxylic acid copolymers, polycarboxylic acid salts, etc. are preferably used. Addition of the dispersant can reduce the viscosity of the slurry before molding and impart high fluidity to the slurry.

The gelling agent may contain, for example, an isocyanate, a polyol, and a catalyst. The isocyanate is not particularly limited as long as it is a substance having an isocyanate group as a functional group. Examples thereof include tolylene diisocyanate (TDI), diphenylmethane diisocyanate (MDI), and modified products thereof. Reactive functional groups other than isocyanate groups may be contained in the molecule. Furthermore, as in polyisocyanate, a large number of reactive functional groups may be contained. The polyol is not particularly limited as long as it is a substance having two or more hydroxyl groups that can react with isocyanate groups. Examples thereof include ethylene glycol (EG), polyethylene glycol (PEG), propylene glycol (PG), polypropylene glycol (PPG), polytetramethylene glycol (PTMG), polyhexamethylene glycol (PHMG), and polyvinyl alcohol (PVA). The catalyst is not particularly limited as long as it is a substance that accelerates a urethane reaction between the isocyanate and the polyol. Examples thereof include triethylenediamine, hexanediamine, and 6-dimethylamino-1-hexanol.

In this step (a), preferably, first, a solvent and a dispersant are added to an alumina powder and a magnesium fluoride powder in a predetermined ratio, and these components are mixed for a predetermined time to prepare a slurry precursor. Preferably, a gelling agent is then added to the slurry precursor, and the resulting mixture is mixed and defoamed in a vacuum to prepare a slurry. The mixing method for preparing the slurry precursor and the slurry is not particularly limited. For example, a ball mill, rotary and revolutionary stirring, vibration stirring, blade stirring, or the like can be employed. It should be noted that a slurry prepared by adding a gelling agent to a slurry precursor is preferably poured into a molding die as soon as possible because a chemical reaction (urethane reaction) of the gelling agent starts to proceed with time. The slurry poured into the molding die is subjected to gelation as a result of a chemical reaction of the gelling agent contained in the slurry. The chemical reaction of the gelling agent is a urethane reaction that occurs between the isocyanate and the polyol and produces a urethane resin (polyurethane). The slurry is subjected to gelation as a result of the reaction of the gelling agent and the urethane resin functions as an organic binder.

(b) Preparation of Calcined Bodies (Refer to FIG. 2(b))

The first to third molded bodies 51 to 53 are dried, then degreased, and further calcined to obtain first to third calcined bodies 61 to 63. The drying of the molded bodies 51 to 53 is performed in order to evaporate a solvent contained in the molded bodies 51 to 53. The drying temperature and the drying time can be appropriately determined in accordance with the solvent used. Note that the drying temperature is carefully determined so that cracks are not formed in the molded bodies 51 to 53 during drying. The atmosphere may be any of an air atmosphere, an inert atmosphere, and a vacuum atmosphere. The degreasing of the molded bodies 51 to 53 after drying is performed in order to decompose and remove organic substances such as a dispersant, a catalyst, and a binder. The degreasing temperature can be appropriately determined in accordance with the type of organic substances contained. For example, the degreasing temperature may be determined to 400° C. to 600° C. The atmosphere may be any of an air atmosphere, an inert atmosphere, and a vacuum atmosphere. The calcination of the molded bodies 51 to 53 after degreasing is performed in order to increase the strength thereof and to make the molded bodies 51 to 53 easy to handle. The calcination temperature is not particularly limited, but may be determined to, for example, 750° C. to 900° C. The atmosphere may be any of an air atmosphere, an inert atmosphere, and a vacuum atmosphere.

(c) Printing of Electrode Pastes (Refer to FIG. 2(c))

A heater electrode paste 71 is printed on a surface of the first calcined body 61, and an electrostatic electrode paste 72 is printed on a surface of the third calcined body 63. The two pastes 71 and 72 each contain a $TiSi_2$ powder, an alumina ceramic powder, a binder, and a solvent. Examples of the binder include cellulose binders (such as ethyl cellulose), acrylic binders (such as polymethyl methacrylate), and vinyl binders (such as polyvinyl butyral). An example of the solvent is terpineol. An example of the printing method is a screen printing method.

(d) Hot-Press Firing (Refer to FIG. 2(d))

The first calcined body 61 and the second calcined body 62 are overlapped with each other so as to sandwich the printed heater electrode paste 71 therebetween, and the second calcined body 62 and the third calcined body 63 are overlapped with each other so as to sandwich the printed electrostatic electrode paste 72 therebetween. Hot-press firing is performed in this state using a die composed of graphite. As a result, the heater electrode paste 71 is fired and becomes a heater electrode 14, the electrostatic electrode paste 72 is fired and becomes an electrostatic electrode 16, and the calcined bodies 61 to 63 are sintered and integrated, and become an alumina ceramic base 12. Thus, an electrostatic chuck 10 is obtained. In the hot-press firing, the pressing pressure is preferably 30 to 300 kgf/cm² and more preferably 50 to 250 kgf/cm² at least at the maximum temperature (firing temperature). Since magnesium fluoride has been added to an alumina powder, the maximum temperature may be determined to be low (1,120° C. to 1,300° C.) as compared with the case where magnesium fluoride is not added. The atmosphere may be appropriately selected from an air atmosphere, an inert atmosphere, and a vacuum atmosphere.

2. Second Production Procedure (Refer to FIG. 3)

(a) Preparation of Molded Bodies (Refer to FIG. 3(a))

First to third molded bodies 51 to 53 are prepared. This step is the same as the step described in "(a) Preparation of molded bodies" of "1. First production procedure".

(b) Printing of Electrode Pastes (Refer to FIG. 3(b))

A heater electrode paste 71 is printed on a surface of the first molded body 51, and an electrostatic electrode paste 72 is printed on a surface of the third molded body 53. The two pastes 71 and 72 are the same as the pastes used in "(c) Printing of electrode pastes" of "1. First production procedure".

(c) Preparation of Calcined Bodies (Refer to FIG. 3(c))

The first to third molded bodies 51 to 53 (the first molded body 51 and the third molded body 53 having been subjected to printing) are dried, then degreased, and further calcined to obtain first to third calcined bodies 61 to 63. In this step, the printed pastes 71 and 72 become calcined pastes 81 and 82, respectively. This step is the same as the step described in "(b) Preparation of calcined bodies" of "1. First production procedure".

(d) Hot-Press Firing (Refer to FIG. 3(d))

The first calcined body 61 and the second calcined body 62 are overlapped with each other so as to sandwich the calcined paste 81 therebetween, and the second calcined body 62 and the third calcined body 63 are overlapped with each other so as to sandwich the calcined paste 82 therebetween. Hot-press firing is performed in this state. As a result, the calcined paste 81 is fired and becomes a heater electrode 14, the calcined paste 82 is fired and becomes an electrostatic electrode 16, and the calcined bodies 61 to 63 are sintered and integrated, and become an alumina ceramic base 12. Thus, an electrostatic chuck 10 is obtained. The conditions for the hot-press firing are as described in "(d) Hot-press firing" of "1. First production procedure".

In the second production procedure, electrode pastes are printed on molded bodies, and the molded bodies are then calcined. Therefore, the electrode pastes may be oxidized during calcination. In contrast, in the first production procedure, the molded bodies are calcined and electrodes are then formed on the resulting calcined bodies, and therefore, such a concern is not caused. In this respect, the first production procedure can provide desired electrode properties as compared with the second production procedure.

According to the electrostatic chuck 10 of the present embodiments described in detail above, since the heater electrode 14 containing $TiSi_2$ as a main component is used, the phenomenon of reversal of temperature-dependence of resistivity can be improved, and in addition, the in-plane variation of the electrical resistivity can be sufficiently suppressed. This point has been demonstrated in Example described below.

In particular, since the alumina ceramic base 12 is produced by adding, as a sintering aid, magnesium fluoride to alumina particles and then firing the resulting mixture, the alumina is sufficiently sintered even at a low firing temperature (1,120° C. to 1,300° C.). Furthermore, in such low-temperature firing, since the main component of the heater electrode 14 is $TiSi_2$, carbonization does not substantially occur and the effects described above can be more reliably obtained.

The present invention is not limited to the above-described embodiment. It is clear that the present invention can be implemented in a variety of embodiments without departing from the technical scope thereof.

In the above embodiments, an electrostatic chuck 10 in which the heater electrode 14 and the electrostatic electrode 16 are embedded in the alumina ceramic base 12 has been described as an example of a ceramic heater. Alternatively, for example, the ceramic heater may be an electrostatic chuck in which only the heater electrode 14 is embedded in the alumina ceramic base 12.

In the embodiments described above, the alumina ceramic base 12 is used. Alternatively, ceramics (for example, aluminum nitride) other than alumina may be used.

In the above embodiments, the first production procedure and the second production procedure have been described as methods for producing the electrostatic chuck 10. However, the method is not limited thereto, and any method may be employed as long as the electrostatic chuck 10 can be produced. For example, in step (a), a gel-casting method is employed. However, the molded bodies may be prepared without employing the gel-casting method. Alternatively, the electrostatic chuck 10 may be produced as follows. Two alumina sintered bodies are prepared, and an electrode paste is printed on a surface of each of the alumina sintered bodies. One of the alumina sintered bodies is placed in a molding die such that the printed surface is disposed on the upper side. A raw material powder containing an alumina powder and magnesium fluoride is placed on the alumina sintered body. The other alumina sintered body is placed on the raw material powder such that the printed surface is disposed on the lower side. Hot-press firing is then conducted.

EXAMPLES

Example 1

An electrostatic chuck 10 was produced by the first production procedure described above (refer to FIG. 2).

(a) Preparation of Molded Bodies

One hundred parts by weight of an alumina powder (average particle diameter: 0.5 µm, purity: 99.99%), 0.2 parts by weight of magnesia, 0.3 parts by weight of magnesium fluoride, 3 parts by weight of a polycarboxylic acid copolymer serving as a dispersant, and 20 parts by weight of a polybasic acid ester serving as a solvent were weighed. These components were mixed using a ball mill (trommel) for 14 hours to prepare a slurry precursor. A gelling agent containing, namely, 3.3 parts by weight of 4,4'-diphenylmethane diisocyanate serving as an isocyanate, 0.3 parts by weight of ethylene glycol serving as a polyol, and 0.1 parts by weight of 6-dimethylamino-1-hexanol serving as a catalyst was added to the slurry precursor, and the resulting mixture was mixed using a rotary and revolutionary stirrer for 12 minutes to prepare a slurry. The slurry was poured into first to third molding dies. Subsequently, the slurry in the molding dies was left to stand at 22° C. for two hours to cause gelation of the slurry by causing a chemical reaction of the gelling agent in each of the molding dies. The molding dies were then removed. Thus, a first molded body 51, a second molded body 52, and a third molded body 53 were obtained from the first molding die, the second molding die, and the third molding die, respectively (refer to FIG. 2(a)).

(b) Preparation of Calcined Bodies

The first to third molded bodies 51 to 53 were dried at 100° C. for ten hours, then degreased at a maximum temperature of 500° C. for one hour, and further calcined in an air atmosphere at a maximum temperature of 820° C. for one hour. Thus, first to third calcined bodies 61 to 63 were obtained (refer to FIG. 2(b)).

(c) Printing of Electrode Pastes

A $TiSi_2$ powder and an alumina powder were prepared so that the alumina content was 5% by weight. Polymethyl methacrylate serving as a binder and terpineol serving as a solvent were added to these powders and the resulting mixture was mixed to prepare an electrode paste. This electrode paste was used for both an electrostatic electrode and a heater electrode. Subsequently, a heater electrode paste 71 was printed on a surface of the first calcined body 61 by screen printing, and an electrostatic electrode paste 72 was printed on a surface of the third calcined body 63 by screen printing (refer to FIG. 2(c)).

(d) Hot-Press Firing

The first calcined body 61 and the second calcined body 62 were overlapped with each other so as to sandwich the heater electrode paste 71 therebetween, and the second calcined body 62 and the third calcined body 63 were overlapped with each other so as to sandwich the electrostatic electrode paste 72 therebetween. Hot-press firing was performed in this state using a die composed of graphite. As a result, the heater electrode paste 71 was fired and became a heater electrode 14, the electrostatic electrode paste 72 was fired and became an electrostatic electrode 16, and the calcined bodies 61 to 63 were sintered and integrated, and became an alumina ceramic base 12 (refer to FIG. 2(d)). The hot-press firing was performed by maintaining at a maximum temperature of 1,170° C. for two hours in a vacuum atmosphere at a pressure of 250 $kgf/cm^2$.

Comparative Example 1

An electrostatic chuck 10 was produced as in Example 1 except that the electrode paste was changed in Example 1 described above. The electrode paste was prepared as follows. Specifically, a molybdenum powder, a titanium powder, and an alumina powder were prepared so that the titanium content was 5% by weight, and the alumina content was 20% by weight. Polymethyl methacrylate serving as a binder and terpineol serving as a solvent were added to these powders and the resulting mixture was mixed to prepare an electrode paste.

Comparative Example 2

An electrostatic chuck 10 was produced as in Example 1 except that the electrode paste was changed in Example 1 described above. The electrode paste was prepared as follows. Specifically, a molybdenum powder and an alumina powder were prepared so that the alumina content was 20% by weight. Polymethyl methacrylate serving as a binder and terpineol serving as a solvent were added to these powders and the resulting mixture was mixed to prepare an electrode paste.

Evaluation

Temperature-Dependence of Electrical Resistivity

Figure 4:
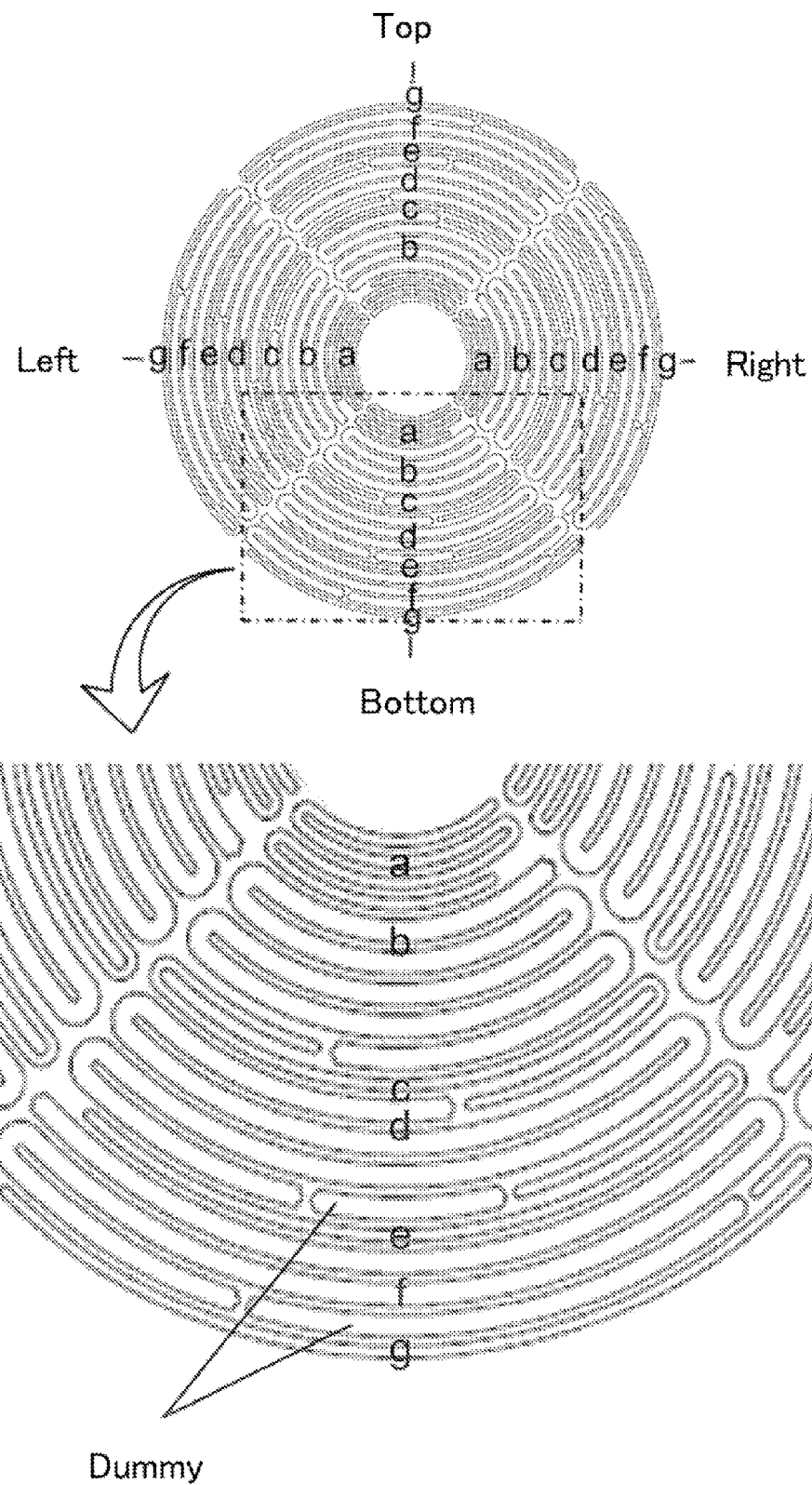
FIG. 4 includes views illustrating the shape of a heater electrode of a test piece.

An electrical resistivity ρ (Ω·cm) was measured by using test pieces corresponding to Example 1 and Comparative Examples 1 and 2. A heater electrode of each of the test pieces was formed so as to have the shape shown in FIG. 4. Specifically, a disc-shaped alumina ceramic base was divided into four sector areas (central angle: 90°), and seven heater lines a to g and two dummy lines were formed on each of the sector areas. Each of the heater lines a to g was formed so as to have a zigzag shape along a circular arc, and terminals were provided at both ends of the heater line. The terminals of each of the heater lines a to g were embedded in advance before the alumina ceramic base 12 was fired, and exposed by cutting the ceramic after firing. The dummy lines were each formed so as to be along a circular arc of a predetermined radius, and terminals were not provided to the dummy lines. Table 1 shows a distance D from a center of the base to a center of each of the heater lines a to g, an electrode width w (mm), and an electrode length L (mm). Although an electrode thickness t (mm) of each of the heater lines a to g is not shown in Table 1, the electrode thickness t (mm) was measured on a cross section obtained by cutting the alumina ceramic base 12 after firing.

TABLE 1

| Heater lines | Distance D(mm) from a center of the base to a center of the heater lines | Electrode width w (mm) | Electrode length L (mm) |
|---|---|---|---|
| a | 38.50 | 2.5 | 231.5 |
| b | 67.25 | 5.0 | 462.3 |
| c | 87.00 | 2.5 | 231.5 |
| d | 99.75 | 5.0 | 463.1 |
| e | 119.50 | 2.5 | 231.5 |
| f | 132.75 | 5.0 | 463.1 |
| g | 145.00 | 2.5 | 231.5 |

Figure 5:
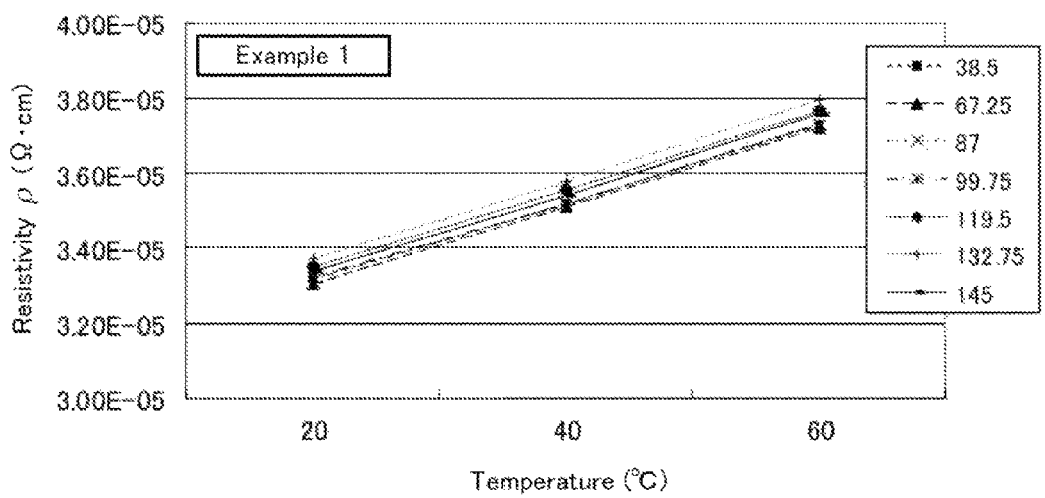
FIG. 5 is a graph of Example 1, the graph showing the relationship among a distance D, a preset temperature, and electrical resistivity.
Figure 6:
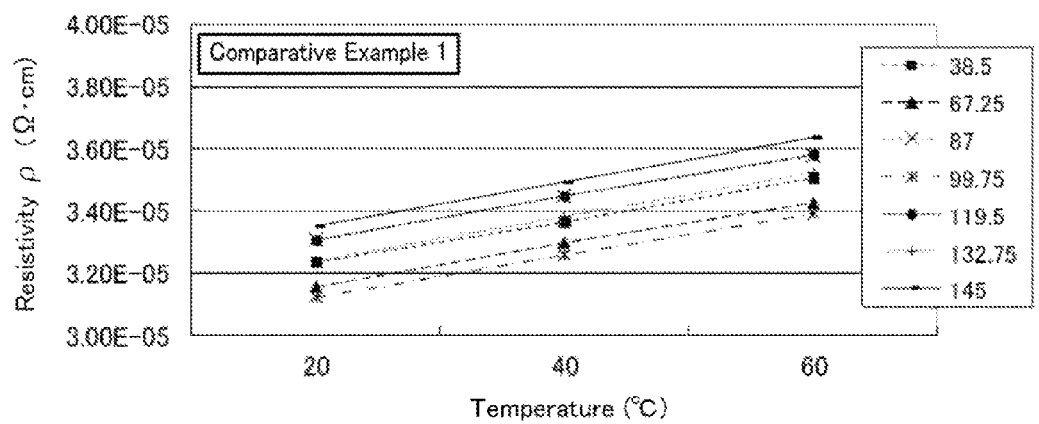
FIG. 6 is a graph of Comparative Example 1, the graph showing the relationship among a distance D, a preset temperature, and electrical resistivity.

Each of the test pieces was set in a thermostatic chamber so that the temperature of each of the test pieces became a temperature determined in advance. The preset temperature was 20° C., 40° C., and 60° C. The electrical resistivity ρ (Ω·cm) of each of the heater lines a to g was determined at each preset temperature. Specifically, after firing, a resistance R (Ω) was measured by applying probes to the terminals provided at both ends of each of the heater lines a to g, and the electrical resistivity ρ (Ω·cm) of each of the heater lines a to g was determined by using a formula below. The reason why a coefficient 10 is multiplied in the right-hand side of the formula is that the unit is converted from Ω·mm into Ω·cm. Regarding Example 1 and Comparative Example 1, the relationship among the distance D from the center of the base to the center of a heater line, the preset temperature, and the electrical resistivity is shown in the graphs of FIGS. 5 and 6, respectively. The numerical values in the legend each represent the distance D (mm). The electrical resistivity ρ used in the vertical axis of the graphs represents the average of the electrical resistivities ρ in the four sector areas.

$$\rho = 10 \times (R \times w \times t)/L$$

In Example 1 and Comparative Example 1, as respectively shown in FIGS. 5 and 6, when the distances D at each preset temperature were arranged so that the electrical resistivities were arranged in ascending order, the order of the distances D was the same regardless of the preset temperature. These results show that the temperature of a wafer W is easily controlled. On the other hand, although the results are not shown in the figure, in Comparative Example 2, when the distances D at each preset temperature were arranged so that the electrical resistivities were arranged in ascending order, the order of the distances D was different depending on the preset temperature (the phenomenon of reversal of temperature-dependence of resistivity). The occurrence of this reversal phenomenon is not preferable because it becomes very complicated to control the temperature of a wafer W.

Figure 7:
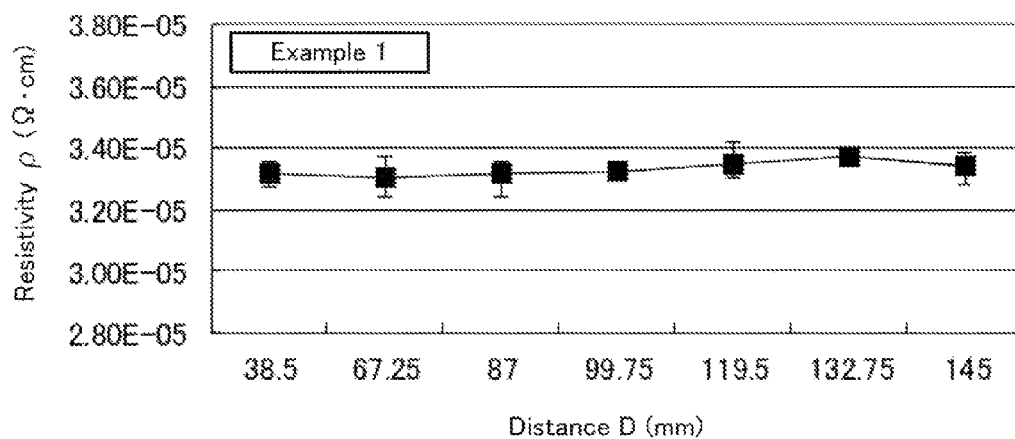
FIG. 7 is a graph of Example 1, the graph showing the relationship between a distance D and electrical resistivity at 20° C.
Figure 8:
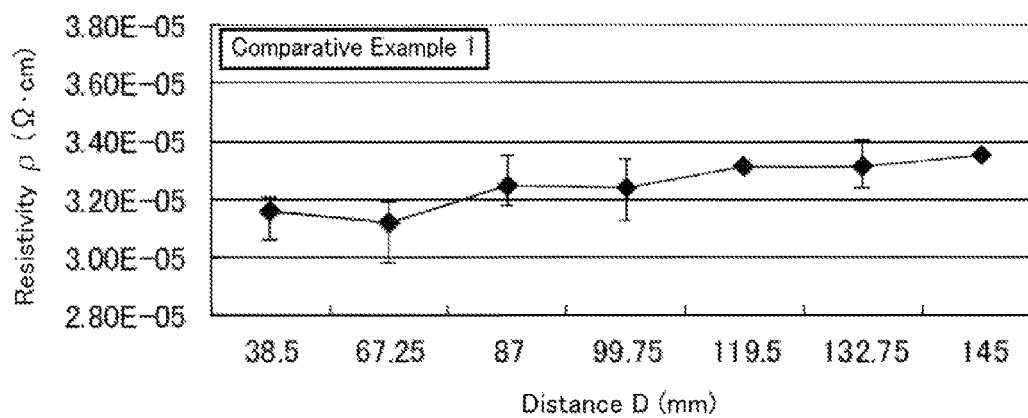
FIG. 8 is a graph of Comparative Example 1, the graph showing the relationship between a distance D and electrical resistivity at 20° C.

In addition, in Example 1, when the temperature was controlled to be each preset temperature, the variation in the resistivity at a distance D was small. However, in Comparative Example 1, the variation was large. FIGS. 7 and 8 are graphs each showing the relationship between the distance D and the resistance when the preset temperature is 20° C. FIG. 7 is a graph of Example 1, and FIG. 8 is a graph of Comparative Example 1. As is apparent from these graphs, in Example 1, the resistivity at 20° C. was substantially constant regardless of the distance D (σ/Ave.=1.3×10$^{-2}$), whereas, in Comparative Example 1, the resistivity at 20° C. varied depending on the distance D (σ/Ave.=3.4×10$^{-2}$). Note that σ represents a standard error of all measurement points, and Ave represents an average.

Thermal Uniformity

A test piece of Comparative Example 1 was placed in a vacuum chamber. A temperature distribution of a surface of the ceramic heater when the temperature of a predetermined reference point became 60° C. was measured from the outside of the chamber with an infrared radiation thermometer (IR camera). The difference ΔT between the maximum temperature and the minimum temperature determined from the temperature distribution was used as an indicator of thermal uniformity. As a result, the thermal uniformity (ΔT) was 3.0° C. The thermal uniformity (ΔT) of Example 1 was determined by calculation from the value of the thermal uniformity (ΔT) of Comparative Example 1 and the graphs of FIGS. 5 and 6. The thermal uniformity (ΔT) of Example 1 was 2.0° C. These results show that Example 1 is good also in terms of thermal uniformity compared with Comparative Example 1.

Color Tone

The brightness L* of the Lab color system was measured. The brightness L* in Example 1 was 79.0, and the brightness L* in Comparative Example 1 was 70.1. These results show that the color tone of Example 1 is white and bright as compared with the color tone of Comparative Example 1. Thus, Example 1 is good in terms of appearance as compared with Comparative Example 1.

An electrostatic chuck was produced by the above-described second production procedure (refer to FIG. 3) in accordance with Example 1. As a result, an electrostatic chuck having substantially the same performance as Example 1 was obtained.

The present application claims priority of Japanese Patent Application No. 2013-058388 filed on Mar. 21, 2013, the entire contents of which are incorporated herein by reference.

What is claimed is:

1. A ceramic heater comprising a ceramic base and a heater electrode embedded in the ceramic base,
   wherein the heater electrode contains TiSi$_2$ as a main component and a material the same as the ceramic base.

2. The ceramic heater according to claim 1,
   wherein the ceramic base is composed of alumina containing magnesium fluoride.

3. A method for producing a ceramic heater comprising the steps of:
   (a) preparing each of a first ceramic molded body and a second ceramic molded body by pouring, into a molding die, a slurry containing an alumina powder, magnesium fluoride serving as a sintering aid, a solvent, a dispersant, and a gelling agent, causing gelation of the slurry by chemically reacting the gelling agent in the molding die, and then removing the molding die;
   (b) obtaining a first ceramic calcined body and a second ceramic calcined body by drying, then degreasing, and further calcining the first ceramic molded body and the second ceramic molded body;
   (c) printing a paste prepared by adding an alumina powder to a TiSi$_2$ powder on a surface of one of the first ceramic calcined body and the second ceramic calcined body; and
   (d) conducting hot-press firing at 1,120° C. to 1,300° C. in a state where the first ceramic calcined body and the second ceramic calcined body are overlapped with each other so as to sandwich the printed paste therebetween.

4. A method for producing a ceramic heater comprising the steps of:
   (a) preparing each of a first ceramic molded body and a second ceramic molded body by pouring, into a molding die, a slurry containing an alumina powder, magnesium fluoride serving as a sintering aid, a solvent, a dispersant, and a gelling agent, causing gelation of the slurry by chemically reacting the gelling agent in the molding die, and then removing the molding die;
   (b) printing a paste prepared by adding an alumina powder to a TiSi$_2$ powder on a surface of one of the first ceramic molded body and the second ceramic molded body;
   (c) obtaining a first ceramic calcined body and a second ceramic calcined body by drying, then degreasing, and further calcining the first ceramic molded body and the second ceramic molded body; and
   (d) conducting hot-press firing at 1,120° C. to 1,300° C. in a state where the first ceramic calcined body and the second ceramic calcined body are overlapped with each other so as to sandwich a portion where the paste has been printed therebetween.

5. The method for producing a ceramic heater according to claim 3, wherein the paste contains an organic substance, and a die used in the hot-press firing is composed of a carbon material.

6. The method for producing a ceramic heater according to claim 4,
wherein the paste contains an organic substance, and a die used in the hot-press firing is composed of a carbon material.

\* \* \* \* \*